United States Patent
Chen

(10) Patent No.: US 8,890,596 B2
(45) Date of Patent: Nov. 18, 2014

(54) CLOCK SIGNAL GENERATING APPARATUS CAPABLE OF REDUCING OR AVOIDING CROSSTALK AND GLITCH SIGNALS, AND METHOD USED IN CLOCK SIGNAL GENERATING APPARATUS

(75) Inventor: Xiao-Fei Chen, Hefei (CN)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/531,609

(22) Filed: Jun. 25, 2012

(65) Prior Publication Data

US 2013/0099843 A1   Apr. 25, 2013

(30) Foreign Application Priority Data

Jul. 5, 2011 (CN) .......................... 2011 1 0186924

(51) Int. Cl.
*H03K 3/01* (2006.01)
*H03K 3/013* (2006.01)
(52) U.S. Cl.
CPC . *H03K 3/01* (2013.01); *H03K 3/013* (2013.01)
USPC ............. 327/293; 327/99; 327/294; 327/296; 327/298

(58) Field of Classification Search
USPC ........... 327/293, 99, 407, 291, 292, 294, 295, 327/296, 298, 142, 155, 156, 159, 162, 163
See application file for complete search history.

(56) References Cited

U.S. PATENT DOCUMENTS

| | | | | |
|---|---|---|---|---|
| 5,373,254 | A * | 12/1994 | Nakauchi et al. | 331/1 A |
| 6,600,345 | B1 * | 7/2003 | Boutaud | 327/99 |
| 7,609,095 | B2 * | 10/2009 | Grand et al. | 327/99 |
| 2005/0259505 | A1 | 11/2005 | Grand | |
| 2008/0094108 | A1 * | 4/2008 | Leon | 327/99 |
| 2013/0063197 | A1 * | 3/2013 | Chen et al. | 327/298 |

* cited by examiner

*Primary Examiner* — Lincoln Donovan
*Assistant Examiner* — Jung H Kim
(74) *Attorney, Agent, or Firm* — Winston Hsu; Scott Margo

(57) ABSTRACT

A clock signal generating apparatus includes a first frequency generating circuit, a second frequency generating circuit, and an output circuit. The first frequency generating circuit is arranged to generate a first clock signal having a first oscillation frequency. The second frequency generating circuit is arranged to generate a second clock signal having a second oscillation frequency. The output circuit is arranged to receive the first and second clock signals. The output circuit is able to output one of the first and second clock signals as an output clock signal according to an oscillation frequency control setting provided by an external bounding pad included within the clock signal generating apparatus.

16 Claims, 7 Drawing Sheets

CLOCK SIGNAL GENERATING APPARATUS CAPABLE OF REDUCING OR AVOIDING CROSSTALK AND GLITCH SIGNALS, AND METHOD USED IN CLOCK SIGNAL GENERATING APPARATUS

BACKGROUND

The present invention relates a clock signal generating scheme, and more particularly to a clock signal generating apparatus implemented by hardware control, and a corresponding method.

Generally speaking, in order to generate two clock signals having different oscillation frequencies, two oscillators such as crystal resonators are respectively employed and configured in a single clock signal generating circuit. However, when the two independent oscillators are configured in the same clock signal generating circuit, it is very easy to introduce crosstalk into clock signals generated by the single clock signal generating circuit. Due to the crosstalk, qualities of the clock signals generated by the clock signal generating circuit having two independent oscillators will be degraded significantly. In addition, if it is required to use a circuit switching scheme to appropriately select a correct clock signal from the different clocks signals generated by the single clock signal generating circuit as an output, then undesired glitch signals may be easily caused and introduced into the whole circuitry system. As a result, the qualities of the clock signals will be degraded significantly due to the undesired glitch signals. Thus, it is very important to provide a scheme for generating two clock signals having different oscillation frequencies and capable of avoiding/reducing signal crosstalk and undesired glitch signals.

SUMMARY

According to an embodiment of the present invention, a clock signal generating apparatus is provided. The clock signal generating apparatus comprises a first frequency generating circuit, a second frequency generating circuit, and an output circuit. The first frequency generating circuit is utilized for generating a first clock signal having a first oscillation frequency. The second frequency generating circuit is utilized for generating a second clock signal having a second oscillation frequency. The output circuit is coupled to the first frequency generating circuit and the second frequency generating circuit and utilized for receiving the first clock signal and the second clock signal. The output circuit includes a first output terminal and a second output terminal. The output circuit is arranged to output one of the first and second clock signals as an output signal outputted via the first output terminal and to output the other of the first and second clock signals as an output signal outputted via the second output terminal according to a same oscillation frequency control setting.

According to an embodiment of the present invention, a method used for a clock signal generating apparatus is disclosed. The method comprises: generating a first clock signal having a first oscillation frequency; generating a second clock signal having a second oscillation frequency; and providing an output circuit including a first output terminal and a second output terminal, utilizing the output circuit to receive the first clock signal and the second clock signal, and outputting one of the first and second clock signals as an output signal outputted via the first output terminal and outputting the other of the first and second clock signals as an output signal outputted via the second output terminal according to a same oscillation frequency control setting.

According to an embodiment of the present invention, a clock signal generating apparatus is disclosed. The clock signal generating apparatus comprises a first frequency generating circuit, a second frequency generating circuit, an output circuit, and an external bonding pad. The first frequency generating circuit is utilized for generating a first clock signal having a first oscillation frequency. The second frequency generating circuit is utilized for generating a second clock signal having a second oscillation frequency. The output circuit is coupled to the first frequency generating circuit and the second frequency generating circuit and utilized for receiving the first clock signal and the second clock signal. The external bonding pad is coupled to the output circuit and utilized for providing an oscillation frequency control setting for the output circuit. The output circuit is arranged to output at least one of the first and second clock signals according to the oscillation frequency control setting.

According to an embodiment of the present invention, a method used for a clock signal generating apparatus is disclosed. The method comprises: generating a first clock signal having a first oscillation frequency; generating a second clock signal having a second oscillation frequency; providing an output circuit for receiving the first clock signal and the second clock signal; utilizing an external bonding pad to provide an oscillation frequency control setting for the output circuit; and outputting at least one of the first and second clock signals as an output clock signal via the output circuit according to the oscillation frequency control setting.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
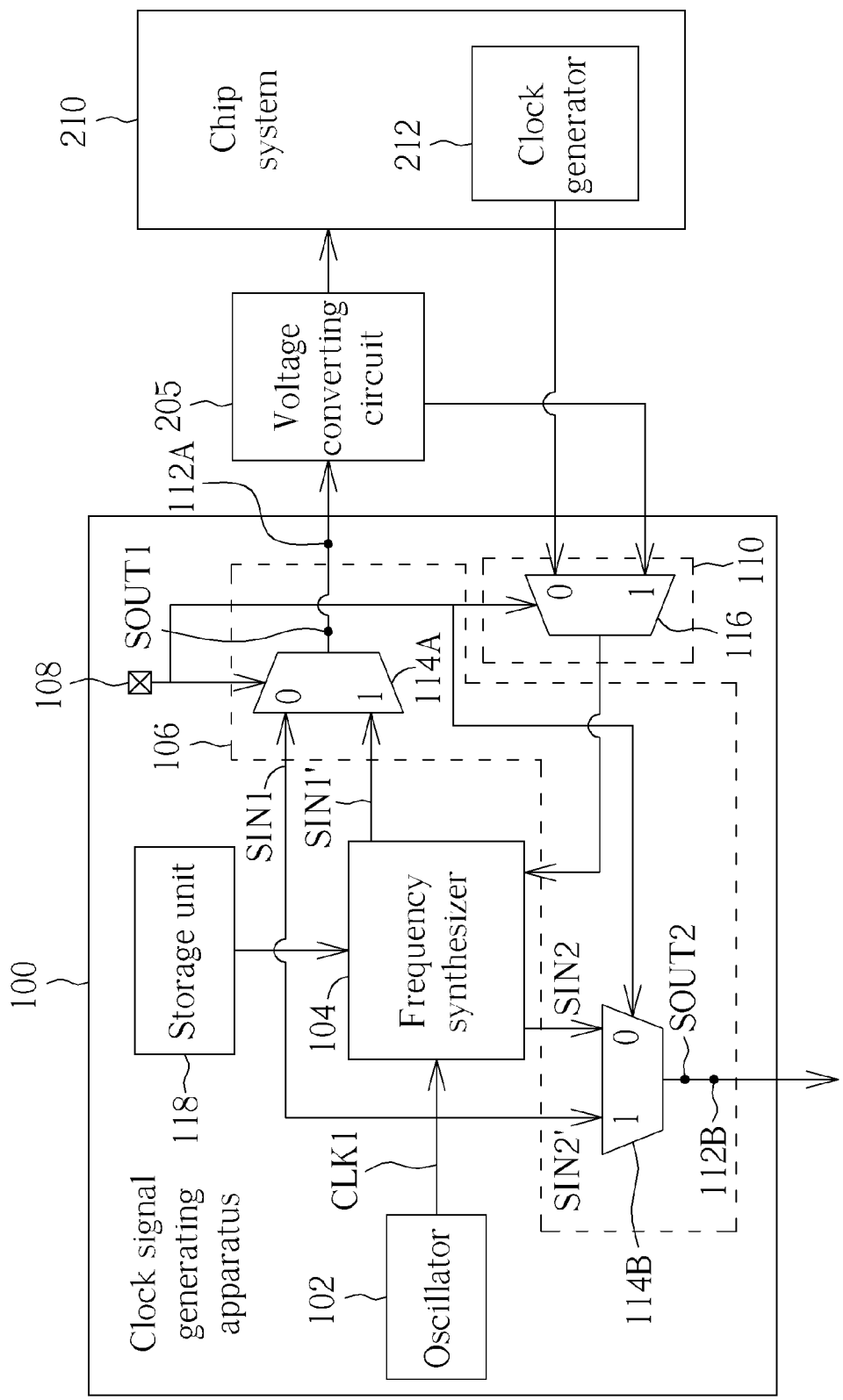
FIG. 1 is a block diagram of a clock signal generating apparatus according a first embodiment of the present invention.

Please refer to FIG. 1, which is a block diagram of a clock signal generating apparatus 100 according a first embodiment of the present invention. The clock signal generating apparatus 100 comprises a first frequency generating circuit 102, a second frequency generating circuit 104, an output circuit 106, an external bonding pad 108, and a setting signal selection circuit 110. The output circuit 106 comprises a first output terminal 112A, a second output terminal 112B, a first multiplexer 114A, and a second multiplexer 114B. The setting signal selection circuit 110 comprises a third multiplexer 116. The first frequency generating circuit 102 is utilized for generating a first clock signal CLK1 having a first oscillation frequency. In this embodiment, the first frequency generating circuit 102 is implemented with an oscillator capable of providing the first clock signal CLK1. The second frequency generating circuit 104 is utilized for generating a second clock signal CLK2 having a second oscillation frequency. In this embodiment, the second frequency generating circuit 104 is implemented with a frequency synthesizer coupled to the oscillator 102 and used for receiving the first clock signal CLK1 generated by the oscillator 102 and generating the second clock signal CLK2 having the second oscillation frequency according to the first clock signal CLK1. The first oscillation frequency and second oscillation frequency are respectively different frequencies. For instance, the first oscillation frequency is equal to 26 Megahertz (MHz), and the second oscillation frequency is a different frequency which is equal to 27 MHz; the frequency synthesizer 104 is arranged to convert the clock signal having 26 MHz frequency to the clock signal having 27 MHz frequency. In another example, the first oscillation frequency can be equal to 27 MHz, and the second oscillation frequency is equal to 26 MHz; the frequency synthesizer 104 is arranged to convert the clock signal having 27 MHz frequency to the clock signal having 26 MHz frequency. That is, in accordance with different circuit requirements, the oscillator 102 is used as an oscillation signal source for generating 26 MHz frequency or 27 MHz frequency, and the frequency synthesizer 104 correspondingly performs frequency conversion (up-conversion or down-conversion) in accordance with the oscillation frequency generated by the oscillator 102 to obtain the clock signal CLK2 having different frequency. Thus, no matter which frequency (26 MHz or 27 MHz) the input signal of the frequency synthesizer 104 is equal to, clock signals having different frequencies can be generated and outputted by using a combination of the oscillator 102 and the frequency synthesizer 104. The whole function of the clock signal generating apparatus 100 can be regarded as a circuitry element including two separate and independent oscillators.

In this embodiment, in order to prevent from causing glitch signal(s) generated due to signal switching, the output circuit 106 employs two-way signal transmitting paths for respectively transmitting and outputting clock signals having different frequencies. In addition, the oscillation frequency control setting provided by the external bonding pad 108 (a hardware configuration) is further employed with the output circuit 106 so that the output circuit 106 correctly outputs clock signals having corresponding frequencies to corresponding circuitry elements. In practice, the external bonding pad 108 is coupled to the output circuit 106 and the setting signal selection circuit 110, and used for providing the above-mentioned oscillation frequency control setting. Such oscillation frequency control setting can be represented by a voltage signal which may include one of a high logic level '1' and a low logic level '0'. Different logic levels '0' and '1' indicate different control settings. The output circuit 106 is arranged to appropriately control the first and second multiplexers 114A and 114B to respectively select corresponding clock signals by referring to the logic level of the voltage signal wherein the selected clock signals are respectively outputted via the first and second output terminals 112A and 112B. Since the voltage signal of the oscillation frequency control setting can be configured in advance and the first and second multiplexers 114A & 114B do not switch when the oscillator 102 and frequency synthesizer 104 generate the first and second clock signals, the glitch signal caused due to circuit switching can be effectively avoided/reduced. It should be noted that a user can appropriately alter the above-mentioned oscillation frequency control setting to obtain different logic levels for the clock signal generating apparatus 100 before the production factory. As a result, the output circuit 106 can control the first and second multiplexers 114A and 114B to appropriately select clock signals that are outputted via the first and second output terminals 112A and 112B, respectively, by referring to different logic levels of different conditions. The logic level corresponding to the above-mentioned oscillation frequency control setting has been configured before the clock signal generating apparatus 100 goes out of the production factory or the integrated circuit chip of the clock signal generating apparatus 100 is encapsulated or packaged via chip package technology. Thus, the output circuit 106 is able to select one of the first clock signal CLK1 and second clock signal CLK2 and then output the selected one via the first output terminal 112A according to the configured oscillation frequency control setting. In addition, in accordance with the configured oscillation frequency control setting, the output circuit 106 is able to select the other of the first clock signal CLK1 and second clock signal CLK2 and then output the selected one via the second output terminal 112B. In other words, when the logic level corresponding to the oscillation frequency control setting has been configured, the output circuit 106 can be regarded as a circuitry element including a signal output function.

Figure 2A:
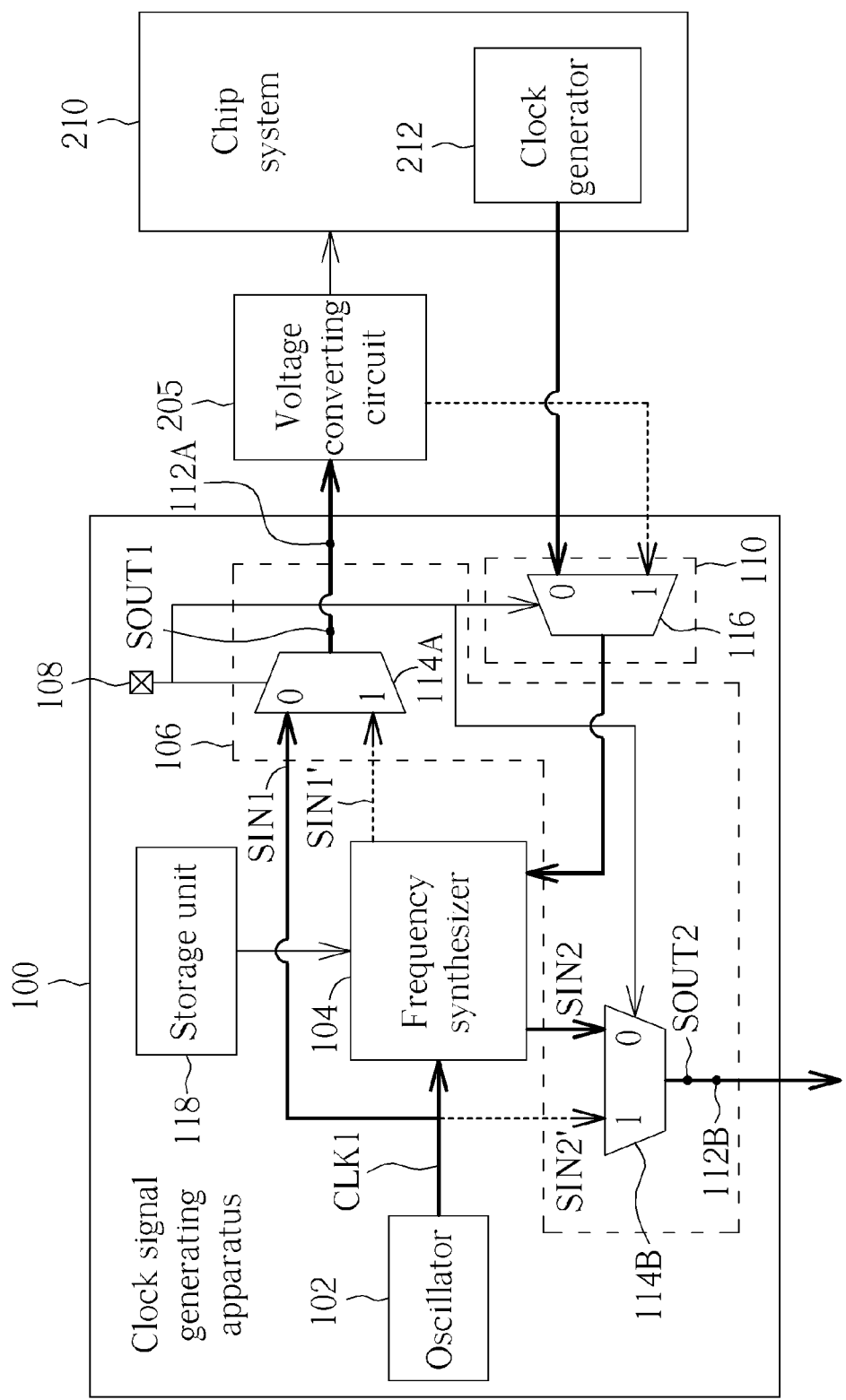
FIG. 2A and FIG. 2B are diagrams showing operations of controlling the first multiplexer and second multiplexer based on different oscillation frequency control settings of the external bonding pad when the oscillator as shown FIG. 1 generates different clock signals in different conditions.
Figure 2B:
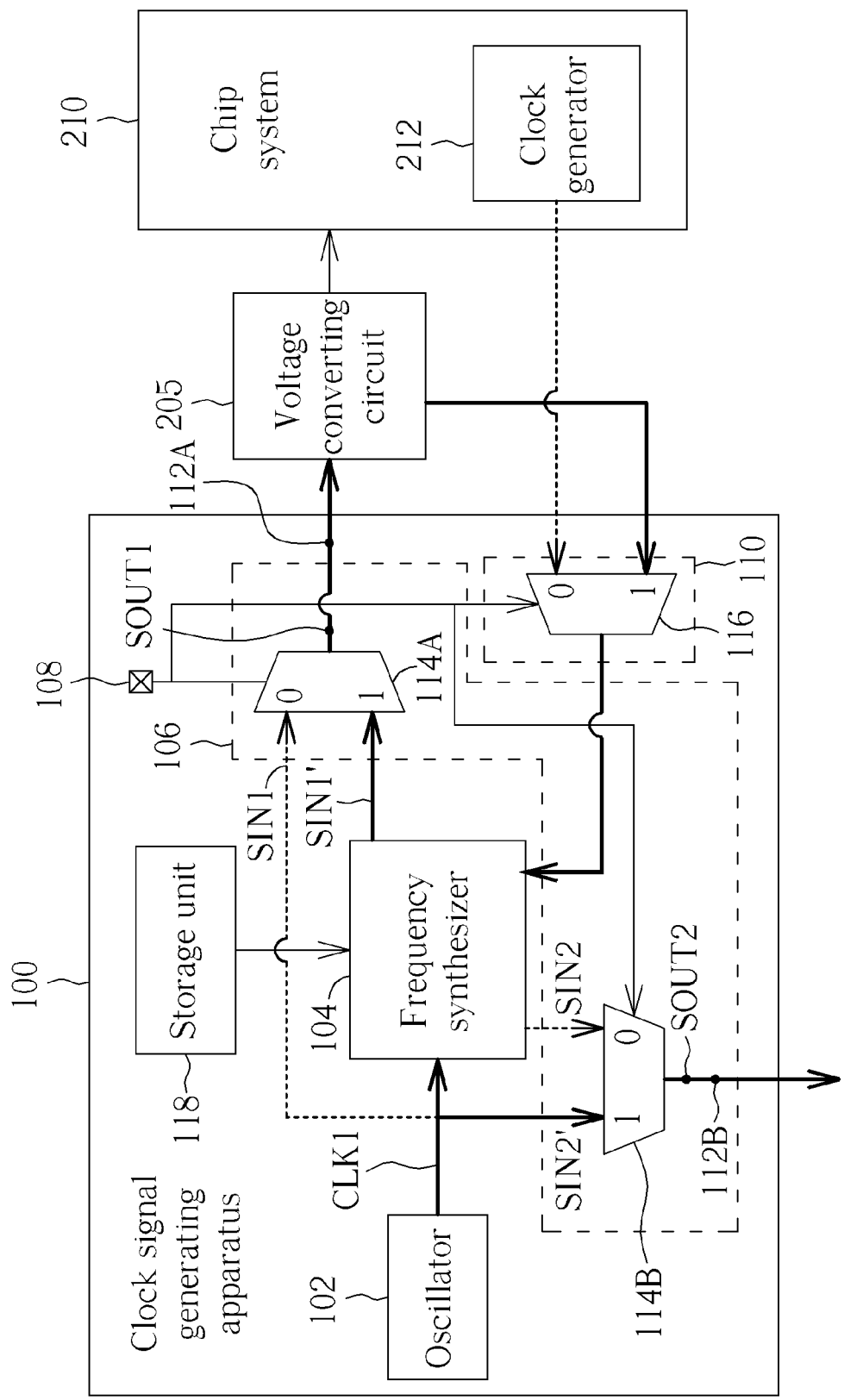

Please refer to FIG. 2A in conjunction with FIG. 2B. FIG. 2A and FIG. 2B are diagrams respectively showing operations of controlling the first multiplexer 114A and second multiplexer 114B based on different oscillation frequency control settings of the external bonding pad 108 when the oscillator 102 generates different clock signals in different conditions. For the operations, as shown in FIG. 2A, the voltage signal corresponding to the configured oscillation frequency control setting of the external bonding pad 108 is configured as the low logic level '0', and the first multiplexer 114A and second multiplexer 114B are respectively arranged to select the input signals received by the first terminals (i.e. the input terminals SIN1 and SIN2) as the output signals of the output terminals SOUT1 and SOUT2 by referring to the low logic level '0'. The signal received by the input terminal SIN1 of the first multiplexer 114A is the first clock signal CLK1 generated by the oscillator 102. The first clock signal CLK1 is generated by the oscillator 102 and then transmitted to the input terminal SIN1 of the first multiplexer 114A without being processed by frequency conversion of the frequency synthesizer 104. The signal received by the input terminal SIN1' of the first multiplexer 114A is the clock signal passing through the frequency synthesizer 104. It should be noted that in this embodiment the first clock signal CLK1 includes the first oscillation frequency being equal to 27 MHz and the first output terminal 112A of the output circuit 106 is configured for outputting a clock signal having the frequency 27 MHz to a post-stage circuitry element such as the voltage converting circuit 205. Accordingly, the clock signal transmitted from the frequency synthesizer 104 to the input terminal SIN1' of the first multiplexer 114A in this condition is not required to be down-converted; the clock signal passes through bypass circuit element(s) of the frequency synthesizer 104. Since in this condition the first multiplexer 114A is arranged to select the signal received by the input terminal SIN1 as the output signal, the frequency of the clock signal outputted by the first terminal 112A of the output circuit 106 is equal to 27 MHz, and the frequency of such clock signal is not affected/altered by the signal received by the input terminal SIN1' of the first multiplexer 114.

In addition, when the voltage signal corresponding to the configured oscillation frequency control setting of the external bonding pad 108 is configured as the low logic level '0', the signal received by the input terminal SIN2 of the second multiplexer 114B is the second clock signal CLK2 generated by the frequency synthesizer 104 performing down-conversion upon the first clock signal CLK1 of the oscillator 102. The oscillation frequency (i.e. the second oscillation frequency) of the second clock signal CLK2 is equal to 26 MHz. That is, the frequency synthesizer 104 is arranged to down-convert the frequency (i.e. 27 MHz) of the first clock signal CLK1 of the oscillator 102 into the frequency (i.e. 26 MHz) of the second clock signal CLK2. The input terminal SIN2' of the second multiplexer 114B is arranged to directly receive the first clock signal CLK1 generated by the oscillator 102 wherein the frequency of the first clock signal CLK1 is equal to 27 MHz. Since the second output terminal 112B of the output circuit 106 is configured for outputting the clock signal having the frequency 26 MHz to a post-stage circuitry element, the second multiplexer 114B is arranged to select the signal received by the input terminal SIN2 as an output by referring to the low logic level '0' of the voltage signal at the external bonding pad 108 so that the frequency of the clock signal outputted via the second output terminal 112B of the output circuit 106 is equal to 26 MHz. The frequency of the clock signal outputted by the second output terminal 112B is not affected by the signal received by the input terminal SIN2' of the second multiplexer 114B.

In addition, as shown in FIG. 2B, the frequency of the first clock signal CLK1 generated by the oscillator 102 is equal to 26 MHz. The voltage signal corresponding to the oscillation frequency control setting of the external bonding pad 108 is configured as the high logic level '1'. The first multiplexer 114A and second multiplexer 114B are respectively arranged to select input signals received by their second terminals (i.e. the input terminals SIN1' and SIN2') as the output signals of the output terminals SOUT1 and SOUT2. The input terminal SIN1 of the first multiplexer 114A is arranged to directly receive the first clock signal CLK1 generated by the oscillator 102. The first clock signal CLK1 is generated by the oscillator 102 and then transmitted to the input terminal SIN1 of the first multiplexer 114A without being processed by frequency-conversion of the frequency synthesizer 104, so the frequency of the clock signal received by the input terminal SIN1 is equal to 26 MHz. The input terminal SIN1' of the first multiplexer 114A is arranged to receive the second clock signal CLK2 generated by the frequency synthesizer 104. It should be noted that the frequency synthesizer 104 is arranged to up-convert the frequency (26 MHz) of the first clock signal CLK1 into the frequency (27 MHz) of the second clock signal CLK2 when the frequency of the first clock signal CLK1 generated by the oscillator 102 is equal to 26 MHz. Since the first multiplexer 114A is arranged to select the clock signal of the input terminal SIN' as an output by referring to the high logic level '1' of the voltage signal at the external bonding pad 108, the first output terminal 112A of the output circuit 106 is arranged to output the second clock signal CLK2 having the frequency 27 MHz to the post-stage circuit element. The frequency of the clock signal outputted via the output terminal 112A is not affected by the signal received by the input terminal SIN1 of the first multiplexer 114A.

For the second multiplexer 114B, when the frequency of the first clock signal CLK1 generated by the oscillator 102 is equal to 26 MHz and the voltage signal corresponding to the oscillation frequency control setting of the external bonding pad 108 is configured as the high logic level '1', the input terminal SIN2 of the second multiplexer 114B is arranged to receive a clock signal passing though the frequency synthesizer 104 without being up-converted by the frequency synthesizer 104. In other words, when the frequency of the first clock signal CLK1 is equal to 26 MHz, the first clock signal CLK1 passes through bypass circuit element(s) of the frequency synthesizer 104. In this condition, the frequency synthesizer 104 does not perform frequency conversion upon the first clock signal CLK1, and the frequency of the clock signal received by the input terminal SIN2 of the second multiplexer 114B is equal to 26 MHz. In addition, the input terminal SIN2' of the second multiplexer 114B is arranged to directly receive the first clock signal CLK1 generated by the oscillator 102 wherein the frequency of the first clock signal CLK1 is equal to 26 MHz. Since in this condition the second multiplexer 114B is arranged to select the clock signal received by the input terminal SIN2' as an output by referring to the high logic level '1', the second output terminal 112B of the output circuit 106 is configured for outputting the first clock signal CLK1 having the frequency 26 MHz to the post-stage circuit elements. Even though the frequency of the clock signal received by the input terminal SIN2 of the second multiplexer 114B is not equal to 26 MHz, the frequency of the clock signal outputted by the second output terminal 112A of the output circuit 106 is not affected due to this.

As mentioned above, no matter which frequency of a clock signal generated by the oscillator 102 as shown in FIG. 2A or in FIG. 2B, by combining the operations of the frequency synthesizer 104 and output circuit 106, it is unnecessary to perform circuit switching upon two clock signals since two signal transmitting paths are employed for respectively transmitting and outputting the two different clock signals. Thus, the glitch signal is not introduced into the circuit elements of the clock signal generating apparatus 100.

Moreover, the frequency synthesizer 104 in this embodiment includes frequency conversion function (including up-conversion and down-conversion). Since two signal transmitting paths are employed for respectively transmitting and outputting the two different clock signals, the frequency synthesizer 104 is arranged to perform frequency conversion processing (up-conversion or down-conversion) for the signal transmitting path employed for outputting a clock signal having the frequency which is different from that of the clock signal received by the input terminal of the frequency synthesizer 104. For example, the first output terminal 112A of the output circuit 106 is utilized for outputting the clock signal having the frequency 27 MHz. When the oscillation frequency of the first clock signal CLK1 generated by the oscillator 102 is equal to 26 MHz which is different from the frequency 27 MHz, the frequency synthesizer 104 is utilized for up-converting the first clock signal CLK1 into the second clock signal CLK2 having the frequency 27 MHz and outputting the second clock signal CLK2 to first multiplexer 114A which is coupled to the first output terminal 112A of the output circuit 106.

In addition, the second output terminal 112B of the output circuit 106 is utilized for outputting the clock signal having the frequency 26 MHz. When the oscillation frequency of the first clock signal CLK1 generated by the oscillator 102 is equal to 27 MHz which is different from 26 MHz, the frequency synthesizer 104 is utilized for down-converting the first clock signal CLK1 into the second clock signal having the frequency 26 MHz and outputting the second clock signal CLK2 to the second multiplexer 114B which is coupled to the second output terminal 112B of the output circuit 106. In other embodiments, when the frequency of the first clock signal CLK1 received by the frequency synthesizer 104 from oscillator 102 is identical to that of the clock signal outputted by a signal transmitting path, the frequency synthesizer 104 can be configured for directly transferring and outputting the first clock signal CLK1 to the output circuit 106 without bypassing the bypass circuit element(s). This is because the frequency synthesizer 104 is responsible for performing frequency conversion. If a certain signal transmitting path within the output circuit 106 is configured for transmitting and outputting a clock signal having the frequency which is identical to that of the clock signal generated by the oscillator 102, then the output circuit 106 is arranged to select the clock signal generated by the oscillator 102 as the output without considering whether to select the clock signal transmitted from the frequency synthesizer 104.

In addition, the frequency 26 MHz or 27 MHz is merely used for illustrative purposes, and is not meant to be a limitation of the present invention. In other embodiments, the frequency 26 MHz or 27 MHz can be replaced by adopting a different oscillation frequency. This modification also falls within the scope of the present invention.

As shown in FIG. 1, the first output terminal 112A of the output circuit 106 is electronically connected to an external chip system 210 via an external voltage converting circuit 205. The voltage external converting circuit 205 and the external chip system 210 can respectively generate different setting signals to perform different performance adjustments for the frequency synthesizer 104. The setting signal selection circuit 110 is arranged to select a corresponding setting signal according to the logic level of the voltage signal corresponding to the oscillation frequency control setting configured at the external bonding pad 108, and output the selected setting signal to the frequency synthesizer 104. In practice, the setting signal selection circuit 110 comprises a third multiplexer 114C which is used to selectively output one of a first setting signal S1 and a second setting signal S2 to the frequency synthesizer 104 according to the oscillation frequency control setting of the external bonding pad 108, for adjusting the performance of the frequency synthesizer 104. The first setting signal S1 is generated by the clock generator 212 in the external chip system 210, and the second setting signal S2 is generated by the external voltage converting circuit 205. Please refer to FIG. 2A in conjunction with FIG. 2B again. When the logic level of the voltage signal corresponding to the oscillation frequency control setting configured at the external bonding pad 108 is a low logic level '0', the third multiplexer 114C is arranged to select the first setting signal S1 as an output signal and transmit the first setting signal S1 to the frequency synthesizer 104 for performing corresponding performance control operation. When the logic level of the voltage signal corresponding to the oscillation frequency control setting configured at the external bonding pad 108 is a high logic level '1', the third multiplexer 114 is arranged to select the second setting signal S2 as an output signal and transmit the second setting signal S2 to the frequency synthesizer 104 for performing another different performance control operation. By the hardware design/configuration of the external bonding pad 108, the clock signal generating apparatus 100 can correctly output clock signals having corresponding frequencies without performing software computing. In addition, the clock signal generating apparatus 100 supports a variety of frequency sources. For example, the oscillator described above can be configured as different oscillation frequency sources in different conditions for providing different frequencies such as 26 MHz or 27 MHz. Therefore, the performance of the whole circuit can be improved.

In addition, in this embodiment, the frequency synthesizer 104 is implemented by employing a low-jitter phase locked loop (PLL) for generating the second clock signal CLK2 having a higher precision. However, this is not meant to be a limitation of the present invention. In other embodiments, other different phase locked loops can be adopted to implement the frequency synthesizer 104. Further, the frequency synthesizer 104 as shown in FIG. 1 comprises a controllable oscillation circuit. It is required to reset the controllable oscillation circuit when the clock signal generating apparatus 100 starts up. In practice, when the oscillator 102 stably outputs the first clock signal CLK1 and the corresponding operating voltage is stable, the frequency synthesizer 104 receives a reset signal. The corresponding operating voltage includes at least one of a normal operating voltage and a low dropout (LDO) operating voltage. In addition, the reset signal is utilized for resetting the controllable oscillating circuit in the frequency synthesizer 104. The reset signal can be further used to indicate that an external condition has been met and then frequency calibration of the frequency synthesizer 104 can be performed.

Figure 3:
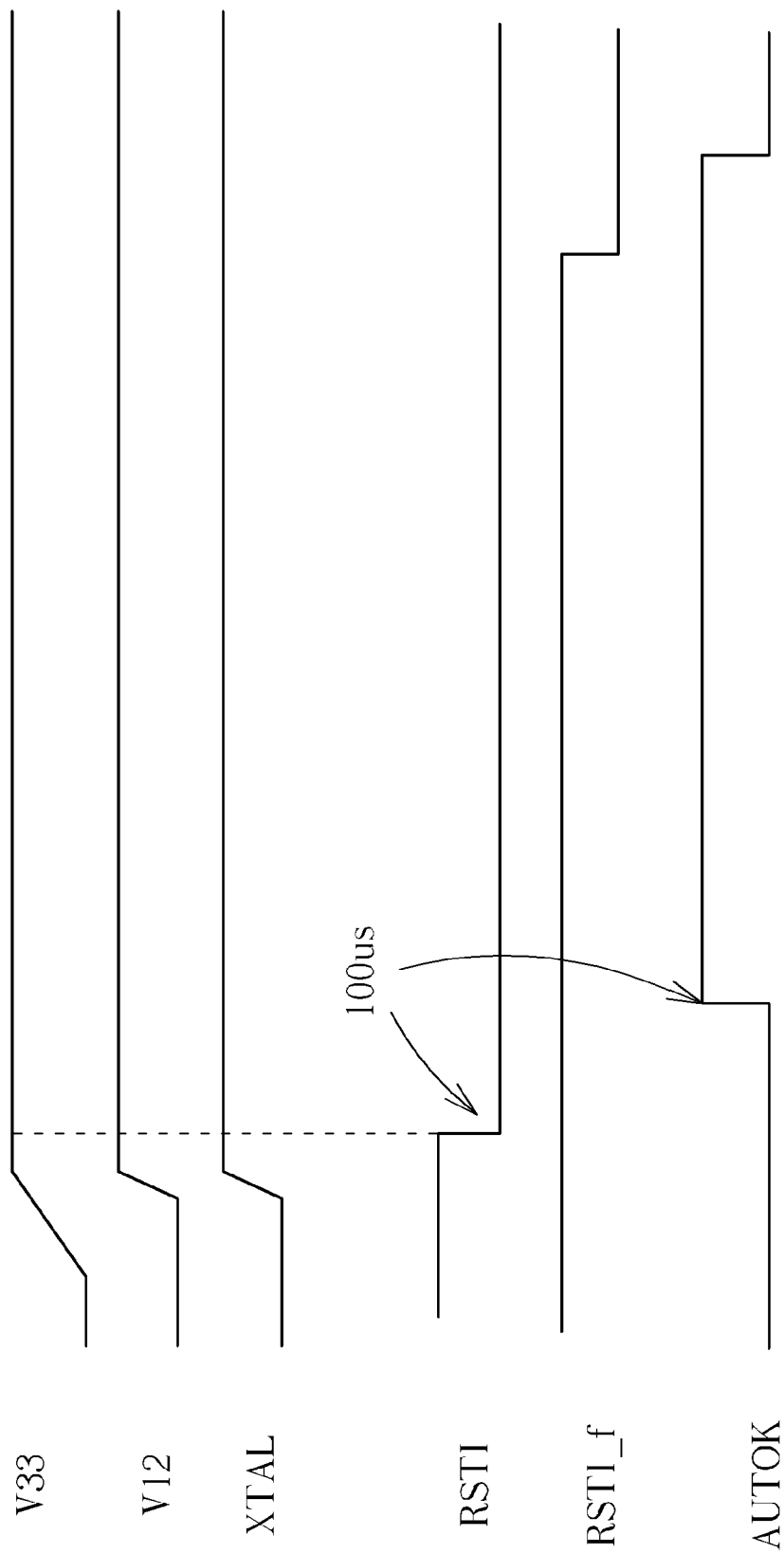
FIG. 3 is a diagram showing frequency calibration of the frequency synthesizer when the clock signal generating apparatus as shown in FIG. 1 receives a reset signal.

Please refer to FIG. 3, which is a diagram showing frequency calibration of the frequency synthesizer 104 when the clock signal generating apparatus 100 receives a reset signal. As shown in FIG. 3, the signal V33 is used to indicate whether a normal operating voltage 3.3V is stable. The signal V12 is used to indicate whether an LDO operating voltage 1.2V is stable. The signal XTAL is used to indicate whether the oscillator 102 stably outputs the first clock signal CLK1. When the signals V33, V12, and XTAL respectively transit from a low voltage level into a high voltage level, this indicates that the normal operating voltage 3.3V and LDO operating voltage 1.2V are stable and the oscillator 102 stably outputs the first clock signal CLK1. In this case, the frequency synthesizer 104 is arranged to receive a reset signal from an external circuit. The signal RSTI as shown in FIG. 3 is used to indicate whether the frequency synthesizer 104 receives the reset signal or not. The signal RSTI transits from the high voltage level to the low voltage level when the frequency synthesizer 104 receives the reset signal. The frequency synthesizer 104 is arranged to wait for a predetermined time period such as 100 microseconds once the signal RSTI transits from the high voltage level to the low voltage level, and then is arranged to perform frequency calibration. The signal AUTOK as shown in FIG. 3 is configured to transit from the low voltage level to the high voltage level to indicate the timing of the frequency calibration starting. In addition, the signal RSTI_f is used to indicate whether the frequency calibration has been completed and whether the external voltage converting circuit 205 has been ready for receiving the signal outputted by the frequency synthesizer 104. Thus, once the frequency calibration has been completed, the signal RSTI_f transits from the high voltage level to the low voltage level. The signal AUTOK does not transits from the high voltage level to the low voltage level until a predetermined time period elapses. The signal AUTOK transiting from the high voltage level to the low voltage level is used to indicate that the frequency calibration is finished. It should be noted that the frequency synthesizer 104 waits for the predetermined time period in order to achieve stable frequency locking after the predetermined time period, and then starts the frequency calibration so as to obtain a calibration result having a higher precision. In addition, the operation of the frequency calibration is optional and is not necessary. For example, it is not required to perform the frequency calibration when the frequency synthesizer 104 is implemented with another type PLL rather than a low-jitter PLL.

Furthermore, as shown in FIG. 1, the clock signal generating apparatus 100 further includes a storage unit 118. The storage unit 118 is implemented by a flip-flop and used for storing a resultant value of the frequency calibration of the frequency synthesizer 104 mentioned above. When the frequency calibration of the frequency synthesizer 104 is performed at a time, the resultant value of the frequency calibration at this time is stored in the storage unit 118. Since the resultant value of the frequency calibration has been recorded in the storage unit 118, the frequency synthesizer 104 can directly refer to the resultant value which is recorded in the storage unit 118 without performing the frequency calibration again when restarting next time. Thus, this can avoid inconvenience and a time-consuming disadvantage caused by starting the frequency calibration again when the frequency synthesizer 104 restarts each time. In the embodiment as shown in FIG. 1, the storage unit 118 is configured to be at the outside of the frequency synthesizer 104 in the clock signal generating apparatus 100. However, this is not intended to be a limitation of the present invention. In another embodiment, the storage unit 118 is configured at the inside of the frequency synthesizer 104. This modification for the circuitry configuration also falls within the scope of the present invention.

Figure 4:
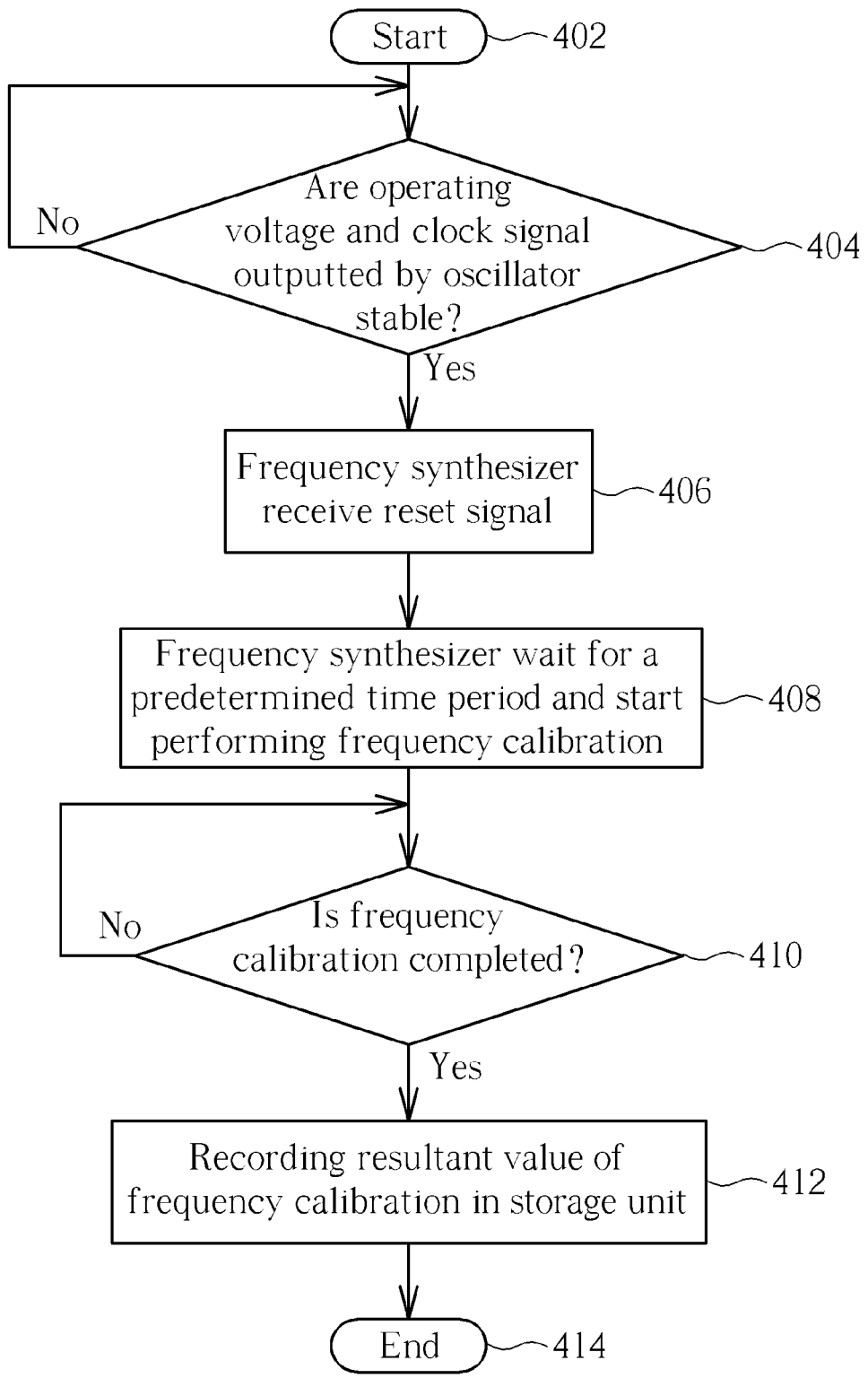
FIG. 4 is a flowchart diagram of the frequency calibration of the frequency synthesizer as shown in FIG. 1.

Please refer to FIG. 4, which is a flowchart diagram of the frequency calibration of the frequency synthesizer 104 as shown in FIG. 1. Provided that substantially the same result is achieved, the steps of the flowchart shown in FIG. 4 need not be in the exact order shown and need not be contiguous, that is, other steps can be intermediate. The detailed description of the steps is mentioned in the following:

Step 402: Start;

Step 404: Are the operating voltage stable and the clock signal outputted by the oscillator 102 stable? If yes, then the flow proceeds to Step 406. Otherwise, the flow continues checking of Step 404;

Step 406: The frequency synthesizer 104 receives the reset signal;

Step 408: The frequency synthesizer 104 waits for a predetermined time period and then starts performing frequency calibration;

Step 410: Is the frequency calibration completed? If yes, the flow proceeds to Step 412. Otherwise, the flow continues checking of Step 410;

Step 412: The resultant value of the frequency calibration is recorded in the storage unit 118; and Step 414: End.

Figure 5:
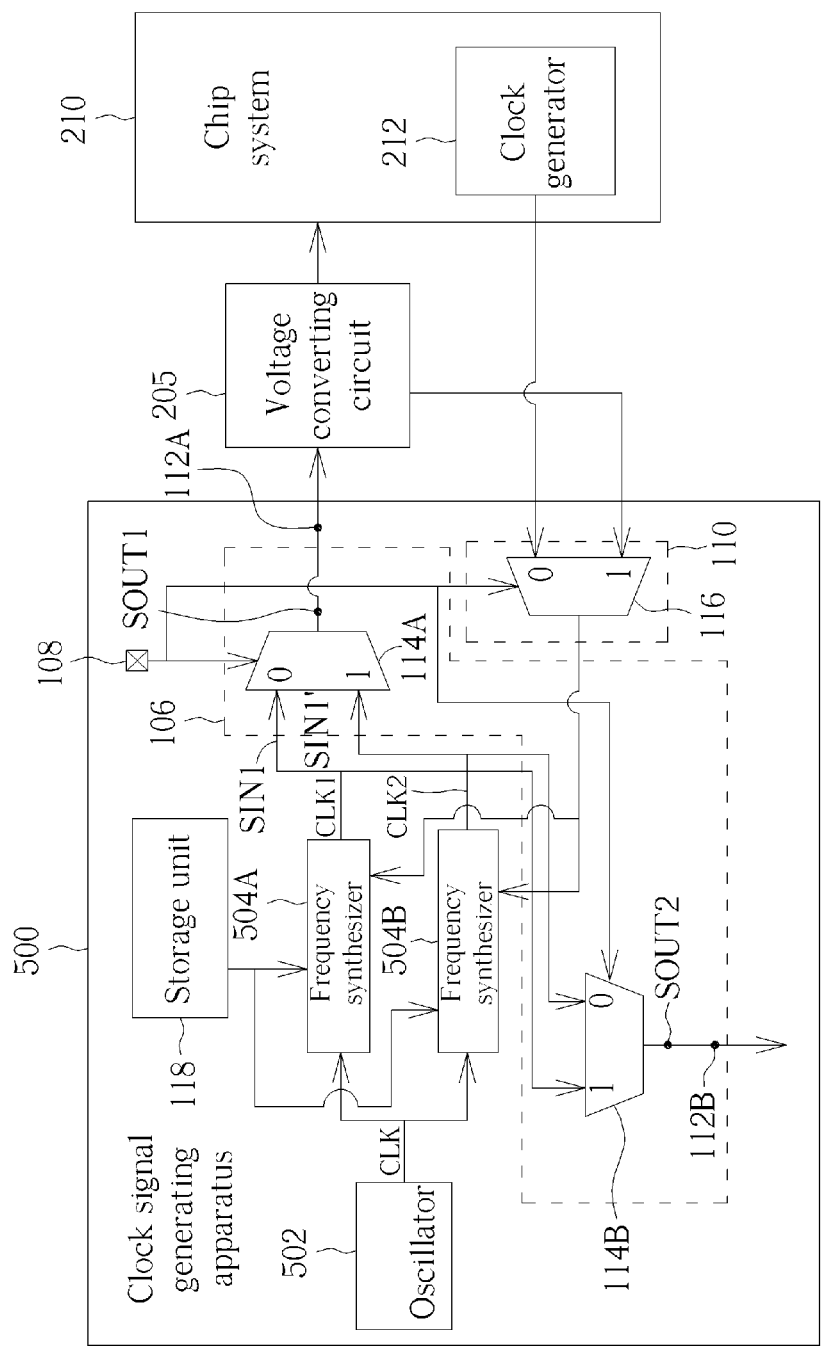
FIG. 5 is a block diagram of a clock signal generating apparatus according to a second embodiment of the present invention.

In addition, in other embodiments, two independent and separate frequency synthesizers are respectively used to generate different clock signals. Please refer to FIG. 5, which is a block diagram of a clock signal generating apparatus 500 according to a second embodiment of the present invention. The clock signal generating apparatus 500 comprises an oscillator 502, a first frequency generating circuit such as the frequency synthesizer 504A in this embodiment, a second frequency generating circuit such as the frequency synthesizer 504B in this embodiment, an output circuit 106, an external bonding pad 108, a setting signal selection circuit 110, and a storage unit 118. The oscillator 502 is used to provide a clock signal CLK having a third oscillation frequency which is different from any of the first and second frequencies. The frequency synthesizer 504A is used for generating and outputting the first clock signal CLK1 mentioned above to the multiplexers 114A and 114B of the output circuit 106. The frequency synthesizer 504B is used for generating and outputting the second clock signal CLK2 mentioned above to the multiplexers 114A and 114B of the output circuit 106. In addition, the operations and functions of the output circuit 106, external bonding pad 108, setting signal selection circuit 110, and storage unit 118 are the same as those described in the first embodiment. The corresponding description is omitted for brevity.

Figure 6:
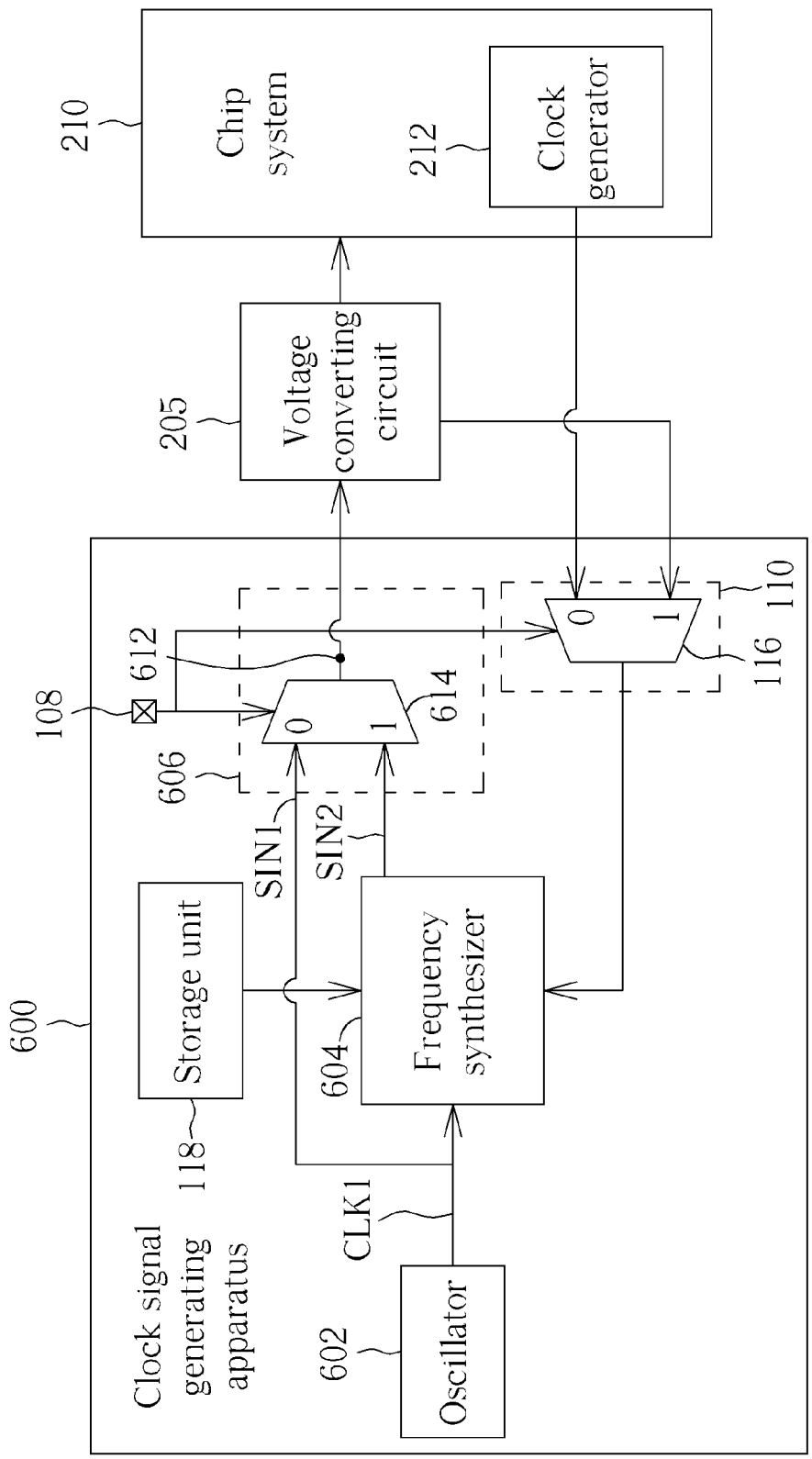
FIG. 6 is a block diagram of a clock signal generating apparatus according to a third embodiment of the present invention.

Please refer to FIG. 6, which is a block diagram of a clock signal generating apparatus 600 according to a third embodiment of the present invention. The clock signal generating apparatus 600 comprises a first frequency generating circuit such as an oscillator 602 of this embodiment, a second frequency generating circuit such as a frequency synthesizer 604 of this embodiment, an output circuit 606, an external bonding pad 108 (i.e. hardware configuration), a setting signal selection circuit 110, and a storage unit 118. The output circuit 606 comprises an output terminal 612 and a multiplexer 614, and the setting signal selection circuit 110 comprises a multiplexer 116. In this embodiment, a user can appropriately alter the oscillation frequency control setting at the external bonding pad 108 to obtain different logic levels before the clock signal generating apparatus 600 goes out of the production factory or the integrated circuit chip of the clock signal generating apparatus 600 is encapsulated or packaged via chip package technology. Thus, by referring to different logic levels under different conditions, the output circuit 606 appropriately controls the multiplexer 114 to select a clock signal from the first clock signal CLK1 generated by the oscillator 602 and the second clock signal CLK2 generated by the frequency synthesizer 604 as an output signal outputted via the output terminal 112. The logic level corresponding to the above-mentioned oscillation frequency control setting has been configured after the clock signal generating apparatus 600 goes out of the production factory or the integrated circuit chip of the clock signal generating apparatus 600 is encapsulated or packaged via chip package technology. Thus, the output circuit 606 is able to select one of the first clock signal CLK1 and second clock signal CLK2 and then output the selected one via the output terminal 112A according to the configured oscillation frequency control setting. In other words, when the logic level corresponding to the oscillation frequency control setting has been configured, the output circuit 606 can be regarded as a circuitry element including the signal output function. It should be noted that the operations and functions of the oscillator 602, frequency synthesizer 604, external bonding pad 108, setting signal selection circuit 110, and storage unit 118 are similar or identical to those having the same names described in the first embodiment. The description is not detailed for brevity. By the hardware design of the external bonding pad 108, the clock signal generating apparatus 600 can correctly output clock signals having corresponding frequencies without performing software computing. In addition, the clock signal generating apparatus 600 supports a variety of frequency sources. For example, the oscillator described above can be configured as different oscillation frequency sources in different conditions for providing different frequencies such as 26 MHz or 27 MHz. Therefore, the performance of the whole circuit can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock signal generating apparatus, comprising:
   a first frequency generating circuit for generating a first clock signal having a first oscillation frequency;
   a second frequency generating circuit for generating a second clock signal having a second oscillation frequency;
   an output circuit, coupled to the first frequency generating circuit and the second frequency generating circuit, for receiving the first clock signal and the second clock signal, the output circuit including a first output terminal and a second output terminal, the output circuit being arranged to output one of the first and second clock signals as an output signal outputted via the first output terminal and to output the other of the first and second clock signals as an output signal outputted via the second output terminal according to a same oscillation frequency control setting; and
   a setting signal selection circuit, coupled to the second frequency generating circuit, for selecting one of a first setting signal and a second setting signal according to the oscillation frequency control setting, and outputting a selected setting signal to the second frequency generating circuit for adjusting the second frequency generating circuit.

2. The clock signal generating apparatus of claim 1, wherein the first frequency generating circuit is an oscillator, and the second frequency generating circuit is a frequency synthesizer; and, the frequency synthesizer is coupled to the oscillator and utilized for receiving the first clock signal and generating the second clock signal according to the first clock signal.

3. The clock signal generating apparatus of claim 1, further comprising:
   an external bonding pad for providing the oscillation frequency control setting for the output circuit.

4. The clock signal generating apparatus of claim 1, wherein the output circuit comprises:
   a first multiplexer, coupled to the first frequency generating circuit and the second frequency generating circuit, for selectively outputting one of the first and second clock signals as the output signal of the first output terminal according to the oscillation frequency control setting; and
   a second multiplexer, coupled to the first frequency generating circuit and the second frequency generating circuit, for selectively outputting the other of the first and second clock signals as the output signal of the second output terminal according to the oscillation frequency control setting.

5. The clock signal generating apparatus of claim 1, wherein the setting signal selection circuit comprises a multiplexer used for selectively outputting one of the first and second setting signals to the second frequency generating circuit according to the oscillation frequency control setting to adjust the second frequency generating circuit; and, the first setting signal is generated by a clock generator of an external chip system, and the second setting signal is generated by an external voltage converting circuit.

6. The clock signal generating apparatus of claim 1, wherein the second frequency generating circuit is a frequency synthesizer including a controllable oscillating circuit, and the frequency synthesizer is used for receiving a reset signal when the controllable oscillating circuit stably outputs the first clock signal and an operating voltage becomes stable; and the reset signal is used for resetting the controllable oscillating circuit of the frequency synthesizer.

7. The clock signal generating apparatus of claim 1, wherein the second frequency generating circuit is arranged to perform frequency calibration to adjust frequency jitter when the second frequency generating circuit has waited for a specific time period after the second oscillation frequency is locked.

8. The clock signal generating apparatus of claim 7, wherein the clock signal generating apparatus further comprises a Flip-Flop used for storing a calibration resultant value of the frequency calibration.

9. A method used for a clock signal generating apparatus, comprising:
   generating a first clock signal having a first oscillation frequency;
   generating a second clock signal having a second oscillation frequency;
   providing an output circuit including a first output terminal and a second output terminal, utilizing the output circuit to receive the first clock signal and the second clock signal, and outputting one of the first and second clock signals as an output signal outputted via the first output terminal and outputting the other of the first and second clock signals as an output signal outputted via the second output terminal according to a same oscillation frequency control setting; and
   selecting one of a first setting signal and a second setting signal according to the oscillation frequency control setting, and utilizing a selected setting signal for adjusting a frequency synthesizing operation.

10. The method of claim 9, wherein the step of generating the first clock signal having the first oscillation frequency comprises:
    utilizing an oscillator to generate the first clock signal; and
    the step of generating the second clock signal having the second oscillation frequency comprises:
    receiving the first clock signal, and generating the second clock signal by a frequency synthesizing operation according to the first clock signal.

11. The method of claim 9, further comprising:
    providing an external bonding pad, and utilizing the external bonding pad to provide the oscillation frequency control setting.

12. The method of claim 9, wherein the step of outputting one of the first and second clock signals as an output signal outputted via the first output terminal comprises:
    selectively outputting one of the first and second clock signals as the output signal of the first output terminal according to the oscillation frequency control setting; and
    outputting the other of the first and second clock signals as an output signal outputted via the second output terminal comprises:
    selectively outputting the other of the first and second clock signals as the output signal of the second output terminal according to the oscillation frequency control setting.

13. The method of claim 9, wherein the first setting signal is generated by a clock generator of an external chip system, and the second setting signal is generated by an external voltage converting circuit.

14. The method of claim 9, wherein the step of generating the second clock signal having the second oscillation frequency comprises:
    generating the second clock signal by a frequency synthesizing operation which includes a controllable oscillating operation; and the method further comprises:
inputting a reset signal into the frequency synthesizing operation when the controllable oscillating operation stably outputs the first clock signal and an operating voltage becomes stable;
wherein the reset signal is used for resetting the controllable oscillating operation.

15. The method of claim 9, further comprising:
performing frequency calibration to adjust frequency jitter when a specific time period has elapsed after the second oscillation frequency is locked.

16. The method of claim 15, further comprising:
providing a Flip-Flop, and using the Flip-Flop to store a calibration resultant value of the frequency calibration.

* * * * *